(12) United States Patent
Lee et al.

(10) Patent No.: US 6,185,032 B1
(45) Date of Patent: Feb. 6, 2001

(54) ORGANIC ELECTROLUMINESCENT DEVICE HAVING A HIGH CONTRAST RATIO

(75) Inventors: Jae-Gyoung Lee, Seongnam-shi; Youngkyoo Kim, Pusan, both of (KR)

(73) Assignee: Ness Co., Ltd., Suwon-si- (KR)

( * ) Notice: Under 35 U.S.C. 154(b), the term of this patent shall be extended for 0 days.

(21) Appl. No.: 09/273,475

(22) Filed: Mar. 22, 1999

(30) Foreign Application Priority Data

Apr. 22, 1998 (KR) .................................................. 98-14336

(51) Int. Cl.⁷ ......................................................... G02F 1/03
(52) U.S. Cl. ............................................ 359/254; 359/239
(58) Field of Search ................................... 359/254, 239; 313/503, 505, 506

(56) References Cited

U.S. PATENT DOCUMENTS 5,932,363 * 8/1999 Hu et al. ................................ 313/503

FOREIGN PATENT DOCUMENTS 04126396 12/1993 (JP).
07024331 8/1996 (JP).

* cited by examiner

Primary Examiner—Hung Xuan Dang
(74) Attorney, Agent, or Firm—Jacobson, Price, Holman & Stern, PLLC

(57) ABSTRACT

A high contrast organic electroluminescent device has a transparent substrate, a transparent electrode layer, a metallic electrode layer, and an organic interlayer disposed between and in close contact with the electrode layers, the organic interlayer being comprised of an organic luminescent layer, an optional hole transport layer and an optional electron transport layer, wherein a dark conductive metal alloy layer is inserted between the organic interlayer and the metallic electrode layer.

2 Claims, 4 Drawing Sheets

ORGANIC ELECTROLUMINESCENT DEVICE HAVING A HIGH CONTRAST RATIO

FIELD OF THE INVENTION

The present invention relates to a high contrast organic electroluminescent device having a thin film of a dark conductive metal alloy disposed between an organic luminescent interlayer and a metallic electrode layer.

BACKGROUND OF THE INVENTION

Generally, an organic electroluminescent device has a laminated structure comprising a transparent electrode layer, a metallic electrode layer, and an organic interlayer including an organic luminescent layer arranged between the two electrodes. In order to increase the luminance efficiency, the organic interlayer may further include hole transport agents and electron transport agents, often in a multilayer configuration.

In case of a direct current(DC) operation, the transparent electrode functions as an anode, and the metallic electrode as a cathode. On applying a voltage to the organic electroluminescent device, the organic luminescent layer emits light towards the transparent electrode layer, wherein the metallic electrode layer functions as a metal mirror which reflects the light originated from the organic luminescent layer. However, as the color of most metallic electrode layers is silver-white, it is often difficult to discern the light-emitting area when the device is placed in a bright environment.

In order to solve the contrast problem in such devices as cathode ray tube, liquid crystal device(LCD) and inorganic electroluminescent device(inorganic ELD), there have been employed two methods, a front attachment method and a rear insert method.

The front attachment method improves the contrast ratio of a cathode ray tube or LCD by applying a circular polarizer, or a color filter, to the front side of a luminescent layer(see, e.g., U.S. Pat. No. 5,596,246; U.S. Pat. No. 5,523,114; U.S. Pat. No. 4,351,681; and U.S. Pat. No. 3,682,531). This method, however, requires a complicated process entailing a high manufacturing cost.

In the rear insert method, a black metallic electrode layer is arranged behind a luminescent layer for enhanced contrast. Alternatively, a light-absorbing layer may be inserted either between a luminescent layer and a metallic electrode layer as an insulating layer, or between an insulating layer and a metallic electrode layer. For the formation of a black metallic electrode layer, U.S. Pat. No. 4,859,904 describes the use of such materials as transition metal oxides, transition metal sulfides, earth metal oxides and earth metal sulfides, e.g., PbS, PbO, CuO, $MnO_2$, $Tb_4O_7$, $Eu_2O_3$, $PrO_2$ and $Ce_2S_3$. Further, U.S. Pat. No. 4,963,788, U.S. Pat. No. 4,870,322, U.S. Pat. No. 4,758,765, U.S. Pat. No. 4,634,639, U.S. Pat. No. 4,455,506, and U.S. Pat. No. 4,287,449 disclose the use of darkly-dyed fillers, metal-doped zinc sulfides, chromes or aluminum oxides as constituents of the light-absorbing layer.

However, the above rear insert method suffers from the problem that the insert layer leads to the generation of an electronic band structure different from that of the original organic electroluminescent device comprising organic double layers, e.g., a hole transport layer and a luminescent/electron transport layer.

Accordingly, there has existed a need to develop a new method for increasing the contrast ratio of an organic electroluminescent device, without the problems of the prior art.

SUMMARY OF THE INVENTION

Accordingly, it is a primary object of the present invention to provide an organic electroluminescent device having an excellent contrast ratio.

In accordance with one aspect of the present invention, there is provided an organic electroluminescent device having a transparent substrate, a transparent electrode layer, a metallic electrode layer, and an organic interlayer disposed between and in close contact with the electrode layers, characterized in that the organic interlayer comprises an organic luminescent layer, an optional hole transport layer and an optional electron transport layer, wherein a dark conductive metal alloy layer is inserted between the organic interlayer and the metallic electrode layer.

BRIEF DESCRIPTION OF THE DRAWINGS

The above and other objects and features of the present invention will become apparent from the following description thereof, when taken in conjunction with the accompanying drawings wherein.

DETAILED DESCRIPTION OF THE INVENTION

Figure 1:
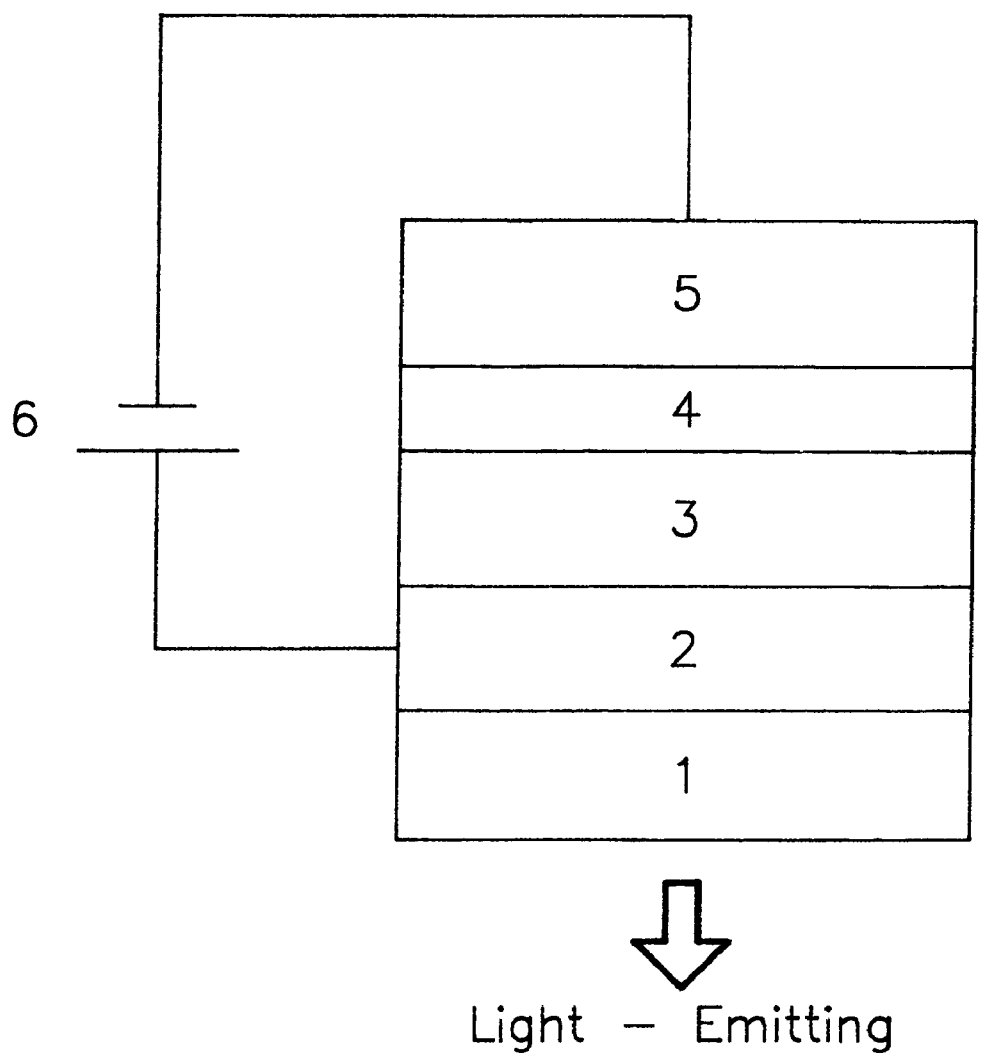
FIG. 1 is a schematic diagram of an organic electroluminescent device prepared in accordance with one embodiment of the present invention.

Referring to FIG. 1, the organic electroluminescent device prepared in accordance with one aspect of the present invention comprises a transparent substrate(1), a transparent electrode layer(2), an organic interlayer(3), a dark conductive metal alloy layer(4) and a metallic electrode layer(5). An electric power supply(6) may be either alternating current(AC) or direct current(DC).

In case of DC operation, the transparent electrode functions as an anode, and the metallic electrode, as a cathode. An indium tin oxide(ITO) layer is usually used as the anode layer coated on a transparent substrate such as glass in accordance with a predetermined pattern, while a metallic layer of magnesium, aluminum, indium, calcium, silver or other metal can be used as the cathode layer.

The organic interlayer comprising an organic luminescent layer may further include a hole transport layer sandwiched between the transparent electrode layer and the organic luminescent layer, and may still further include an electron transport layer inserted between the metallic electrode layer and the organic luminescent layer, often in a multilayer configuration to increase luminance efficiency.

The organic interlayer may thus be in the form of a single layer or multiple layers depending on the desired combination of electronically active materials. As used herein, the term "an electronically active material" refers to one selected from the group consisting of an organic luminescent agent, a hole transport agent, an electron transport agent and a mixture thereof. For example, the organic interlayer may be in the form of double layers consisting of a hole transport/organic luminescent layer and an electron transport layer, or consisting of a hole transport layer and an organic luminescent/electron transport layer. The organic interlayer may also be in the form of triple layers consisting of a hole transport layer, an organic luminescent layer and an electron transport layer.

Exemplary electroluminescent agents include tris(8-hydroxyquinolinolato) aluminum($Alq_3$), 1,1,4,4-tetraphenyl-1,3-butadiene(TB), oligophenylenevinylene derivatives, 4-(dicyanomethylene)-2-methyl-6-(4-dimethylaminostyryl)-4H-pyran(DCM), 1,4-distyrylbenzene, anthracene, tetracene, pentracene, coronene, perylene, pyrene, bis (8-quinolinolato) zinc(II), 9,10-diphenylanthracene, tris(4,4,4-trifluoro-1-(2-thienyl)-1,3-butandiono)-1,10-phenanthroline europium(III), tris(2, 4-pentadiono)-1,10-phenanthroline terbium(III) and tris(4,4, 4-trifluoro-1-(2-thienyl)-1,3-butandiono)-1,10-phenanthroline dysprosium(III), among which $Alq_3$ of formula(I) is preferred. Further, organometallic chelate complexes such as $Alq_3$ have both electroluminescent and electron transporting abilities:

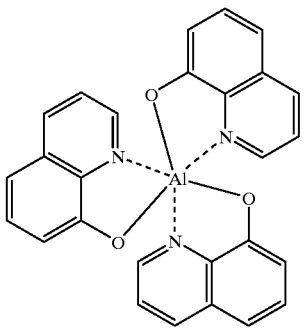

(I)

Exemplary hole transport agents include N,N'-diphenyl-N,N'-bis(3-methylphenyl)-1,1'-diphenyl-4,4'-diamine (TPD), triphenylamine(TPA) and poly(N-vinylcarbazole) (PVK), among which TPD of formula(II) is preferred. As electron transport agents, oxadiazole derivatives such as 2-(4-biphenyl)-5-(4-tert-butylphenyl)-1,3,4-oxadiazole may be used:

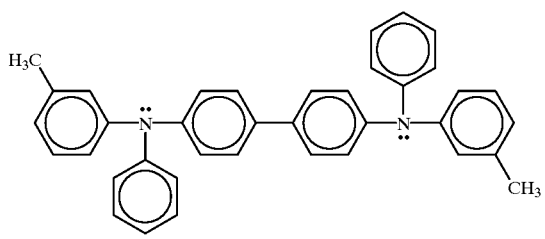

(II)

The thin film of dark conductive metal alloy in accordance with the present invention is disposed between the organic interlayer and the metallic electrode layer. The film renders the area surrounding a light-emitting zone dark, thereby making it possible to discern clearly the light-emitting zone even in bright environment. That is, the dark metal alloy layer functions to enhance the contrast ratio of the organic electroluminescent device. Preferably, a black conductive aluminum-tungsten or aluminum-molybdenum alloy may be employed as the dark metal alloy.

The dark metal alloy layer of the inventive organic electroluminescent device may be formed by vapor deposition or wet coating of an appropriate compound to a desired thickness. In particular, when an aluminum-tungsten or aluminum-molybdenum alloy is used as the dark metal alloy, the two constituents of the metal alloy may be concurrently vapor-deposited on an organic interlayer to form an alloy layer having a thickness ranging from 50 to 150 Å. In case an aluminum film is used as the metallic electrode layer, said alloy deposition may be conveniently followed by continuing the deposition of aluminum.

The present invention is further described and illustrated in Example, which is, however, not intended to limit the scope of the present invention.

EXAMPLE

Indium tin oxide(ITO) was coated on a glass substrate to form a transparent anode layer. The substrate was positioned in a sample holder in a fabricating chamber and, then, TPD and $Alq_3$ were sequentially deposited on the substrate under a reduced pressure to produce a hole transport layer and an organic luminescent/electron transport layer, respectively.

Subsequently, aluminum was placed in an evaporation boat, and an electric current was applied directly to a tungsten wire installed as an electrode for the evaporation boat to heat the tungsten wire to above 2400° C., thereby achieving simultaneous evaporation of aluminum and tungsten. Aluminum and tungsten were codeposited on the organic luminescent/electron transport layer under a chamber pressure of $1.0 \times 10^{-6}$ torr to form a black metal alloy layer of 50% aluminum and 50% tungsten having a thickness of 100 Å. Subsequently, aluminum was deposited on the black metal alloy layer under the same condition to form an aluminum electrode layer having a thickness of 3,000 Å to obtain an organic electroluminescent device in accordance with the present invention.

Comparative Example

The procedure of Example was repeated except that the black metal alloy layer was not deposited, to obtain a conventional organic electroluminescent device.

Figure 2A:
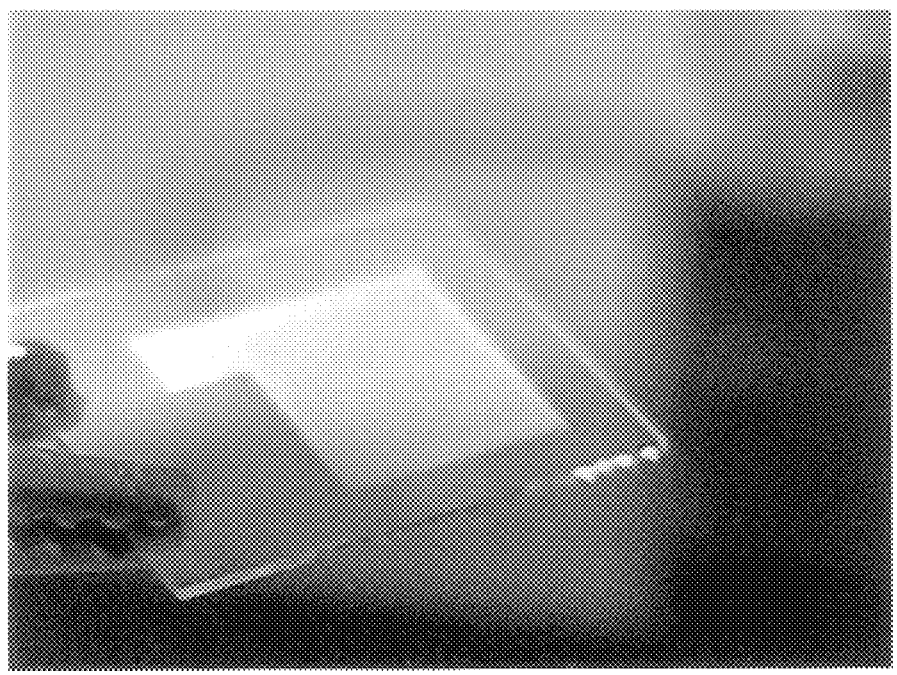
FIGS. 2A and 2B show photographs of a conventional organic electroluminescent device placed in bright environment, taken before and after a voltage application, respectively.
Figure 2B:
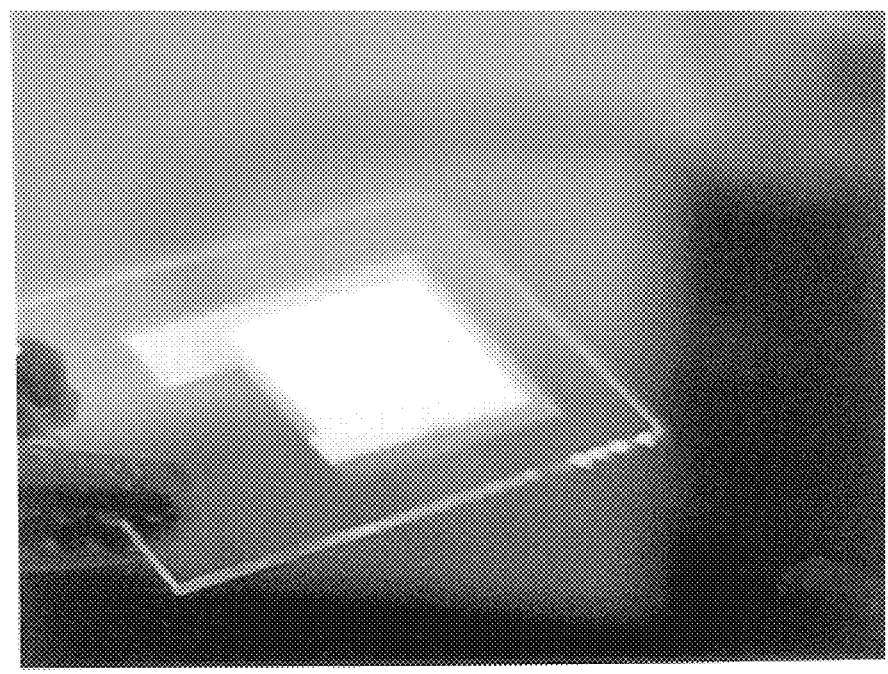
Figure 3A:
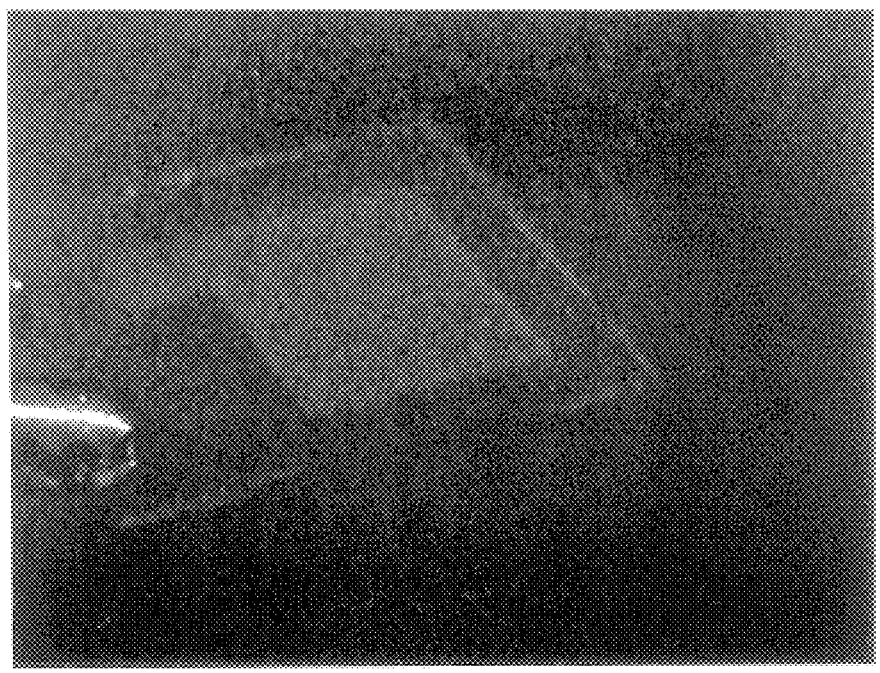
FIGS. 3A and 3B reproduce photographs of a conventional organic electroluminescent device placed in dark environment, taken before and after a voltage application, respectively.
Figure 3B:
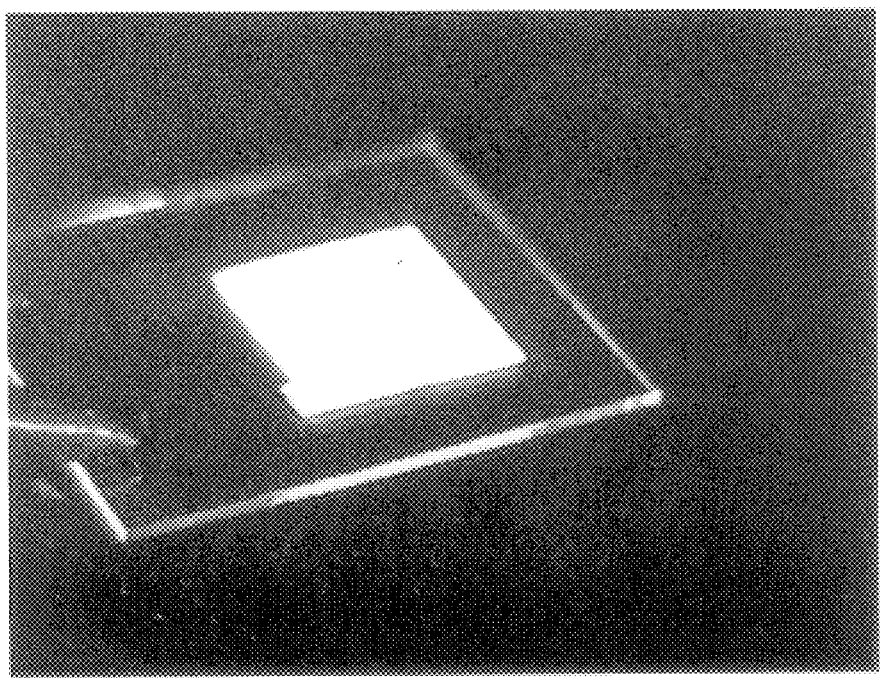

FIGS. 2 and 3 show the photographs of the conventional organic electroluminescent device prepared in Comparative Example, taken in bright and dark environment, respectively. As shown in the above photographs, when placed in bright environment, it is difficult to distinguish whether the device is turned off(9V, FIG. 2A) or whether it is turned on after a voltage application(9V, FIG. 2B). In dark environment, on the other hand, its turn-off status(9V, FIG. 3A) can be distinguished from its turn-on status(9V, FIG. 3B).

Figure 4A:
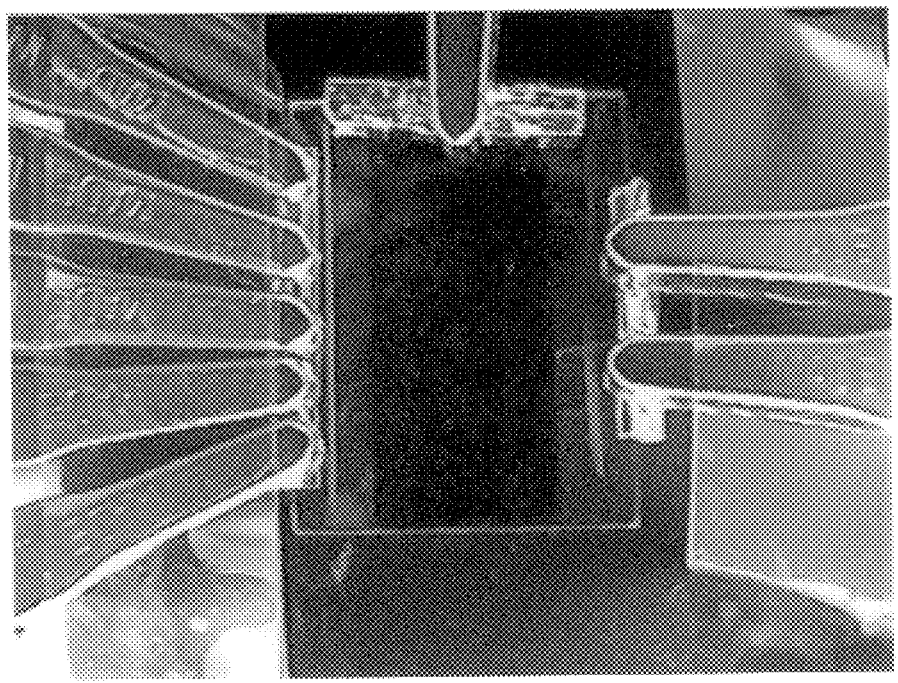
FIGS. 4A and 4B exhibit photographs of the organic electroluminescent device prepared in Example of the present invention placed in bright environment, taken before and after a voltage application, respectively.
Figure 4B:
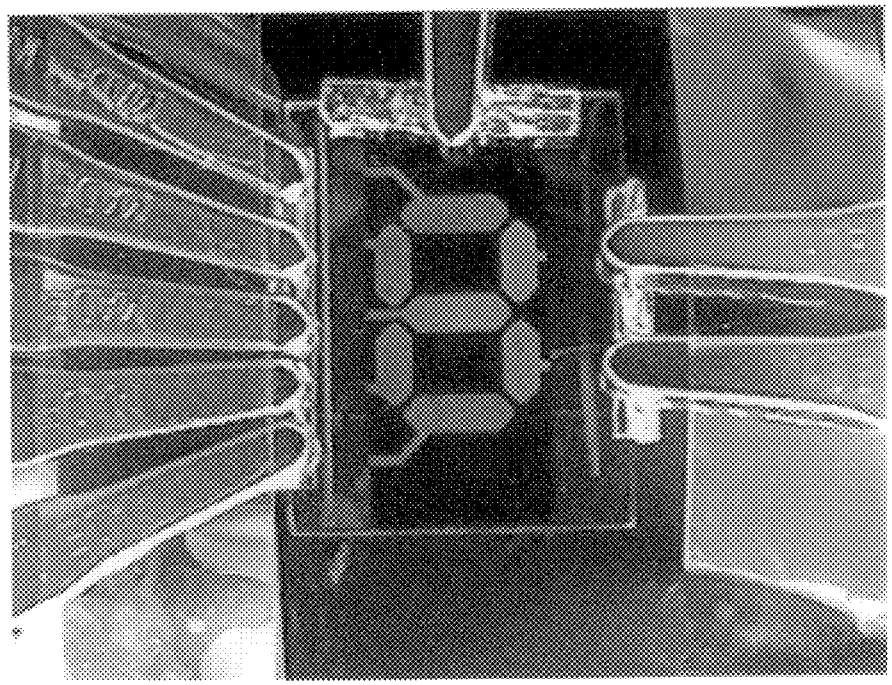

FIGS. 4A and 4B reproduce the photographs of the organic electroluminescent device prepared in Example of the present invention and placed in bright environment before and after a voltage application(9V), respectively. Unlike the indiscernible difference observed in FIG. 2, the organic electroluminescent device of the present invention has such a high contrast ratio that its turn-on image is clearly discernible even in bright environment.

While the invention has been described with respect to the specific embodiments, it should be recognized that various modifications and changes may be made by those skilled in the art to the invention which also fall within the scope of the invention as defined by the appended claims.

What is claimed is:

1. An organic electroluminescent device having a transparent substrate a transparent electrode layer, a metallic electrode layer, and an organic interlayer disposed between and in close contact with the electrode layers, characterized in that the organic interlayer comprises an organic luminescent layer, an optional hole transport layer and an optional electron transport layer, wherein a black aluminum-tungsten or aluminum-molybdenum alloy layer is inserted between the organic interlayer and the metallic electrode layer.

2. The organic electroluminescent device in accordance with claim 1, wherein the aluminum-tungsten or aluminum-molybdenum alloy layer has a thickness ranging from 50 to 150 Å.

* * * * *